United States Patent
Rietzel et al.

(10) Patent No.: US 7,014,741 B2
(45) Date of Patent: Mar. 21, 2006

(54) CYLINDRICAL MAGNETRON WITH SELF CLEANING TARGET

(75) Inventors: James G. Rietzel, Antioch, CA (US); Kevin D. Johnson, Fairfield, CA (US)

(73) Assignee: Von Ardenne Anlagentechnik GmbH, Dresden (DE)

( * ) Notice: Subject to any disclaimer, the term of this patent is extended or adjusted under 35 U.S.C. 154(b) by 0 days.

(21) Appl. No.: 10/371,174

(22) Filed: Feb. 21, 2003

(65) Prior Publication Data

US 2004/0163943 A1    Aug. 26, 2004

(51) Int. Cl.
*C23C 14/34* (2006.01)

(52) U.S. Cl. .............................. 204/298.22; 204/298.21

(58) Field of Classification Search ........... 204/298.21, 204/298.22, 298.12, 192.12
See application file for complete search history.

(56) References Cited

U.S. PATENT DOCUMENTS

| | | | |
|---|---|---|---|
| 4,169,031 A | 9/1979 | Brors ..................... 204/192 R |
| 4,407,713 A | 10/1983 | Zega ......................... 204/298 |
| 5,047,131 A | 9/1991 | Wolfe et al. ........... 204/192.23 |
| 5,096,562 A | 3/1992 | Boozenny et al. ..... 204/298.22 |
| 5,100,527 A | 3/1992 | Stevenson et al. ..... 204/298.22 |
| 5,108,574 A | 4/1992 | Kirs et al. ............. 204/298.22 |
| 5,171,411 A | 12/1992 | Hillendahl et al. .... 204/192.12 |
| 5,213,672 A | 5/1993 | Hartig et al. .......... 204/298.22 |
| 5,225,057 A | 7/1993 | LeFebvre et al. ...... 204/192.13 |
| 5,262,032 A | 11/1993 | Hartig et al. .......... 204/298.21 |
| 5,298,137 A | 3/1994 | Marshall, III .......... 204/192.12 |
| 5,338,422 A | 8/1994 | Belkind et al. ........ 204/192.12 |
| 5,364,518 A | 11/1994 | Hartig et al. .......... 204/298.22 |
| 5,384,021 A | 1/1995 | Thwaites ............... 204/298.21 |
| 5,445,721 A | 8/1995 | Bower ................... 204/192.12 |
| 5,464,518 A | 11/1995 | Sieck et al. ............ 204/192.12 |
| 5,487,821 A | 1/1996 | Sieck et al. ............ 204/192.12 |

(Continued)

FOREIGN PATENT DOCUMENTS

DE    239807 A1 * 10/1986

(Continued)

*Primary Examiner*—Steven Versteeg
(74) *Attorney, Agent, or Firm*—Parsons Hsue & De Runtz LLP

(57) ABSTRACT

A cylindrical magnetron capable of running at high current and voltage levels with a target tube that is self cleaning not only in the center portion, but also at the ends. Sputtering the ends of the target tube virtually eliminates accumulation of condensate at the ends and any resultant arcing, resulting in a more reliable magnetron requiring less service and a magnetron that produces more consistent coatings.

26 Claims, 7 Drawing Sheets

U.S. PATENT DOCUMENTS

| | | | |
|---|---|---|---|
| 5,518,592 A | 5/1996 | Bower et al. | 204/192.12 |
| 5,527,439 A | 6/1996 | Sieck et al. | 204/192.22 |
| 5,529,674 A | 6/1996 | Hedgcoth | 204/298.21 |
| 5,591,314 A | 1/1997 | Morgan et al. | 204/298.22 |
| 5,616,225 A | 4/1997 | Sieck et al. | 204/298.14 |
| 5,627,435 A | 5/1997 | Jansen et al. | 315/111.21 |
| 5,631,050 A | 5/1997 | Thwaites | 427/571 |
| 5,645,699 A | 7/1997 | Sieck | 204/192.12 |
| 5,683,558 A | 11/1997 | Sieck et al. | 204/192.12 |
| 5,725,746 A | 3/1998 | Dickey et al. | 204/298.21 |
| 5,798,027 A | 8/1998 | Lefebvre et al. | 204/192.26 |
| 5,814,195 A | 9/1998 | Lehan et al. | 204/192.12 |
| 5,853,816 A | 12/1998 | Vanderstraeten | 427/452 |
| 5,904,952 A | 5/1999 | Lopata et al. | 427/8 |
| 5,922,176 A | 7/1999 | Caskey | 204/192.12 |
| 6,375,814 B1 | 4/2002 | De Bosscher et al. | 204/298.21 |
| 6,673,221 B1 | 1/2004 | Lynn et al. | 204/298.21 |
| 6,736,948 B1 | 5/2004 | Barrett | 204/298.22 |

FOREIGN PATENT DOCUMENTS

| | | | |
|---|---|---|---|
| WO | WO 99/54911 | * 10/1999 | |
| WO | WO 00 00766 | 1/2000 | |

* cited by examiner

FIG._1A
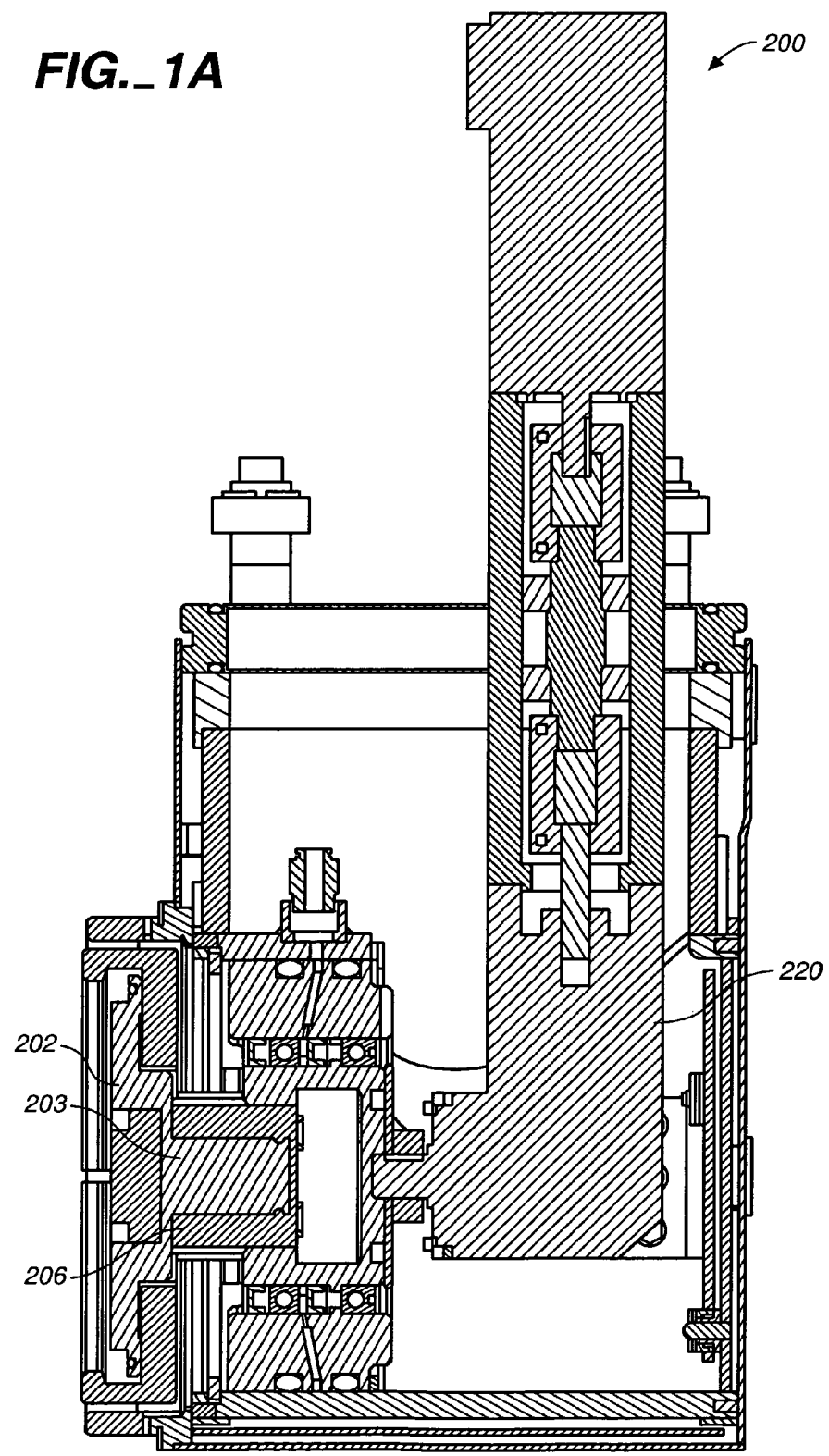

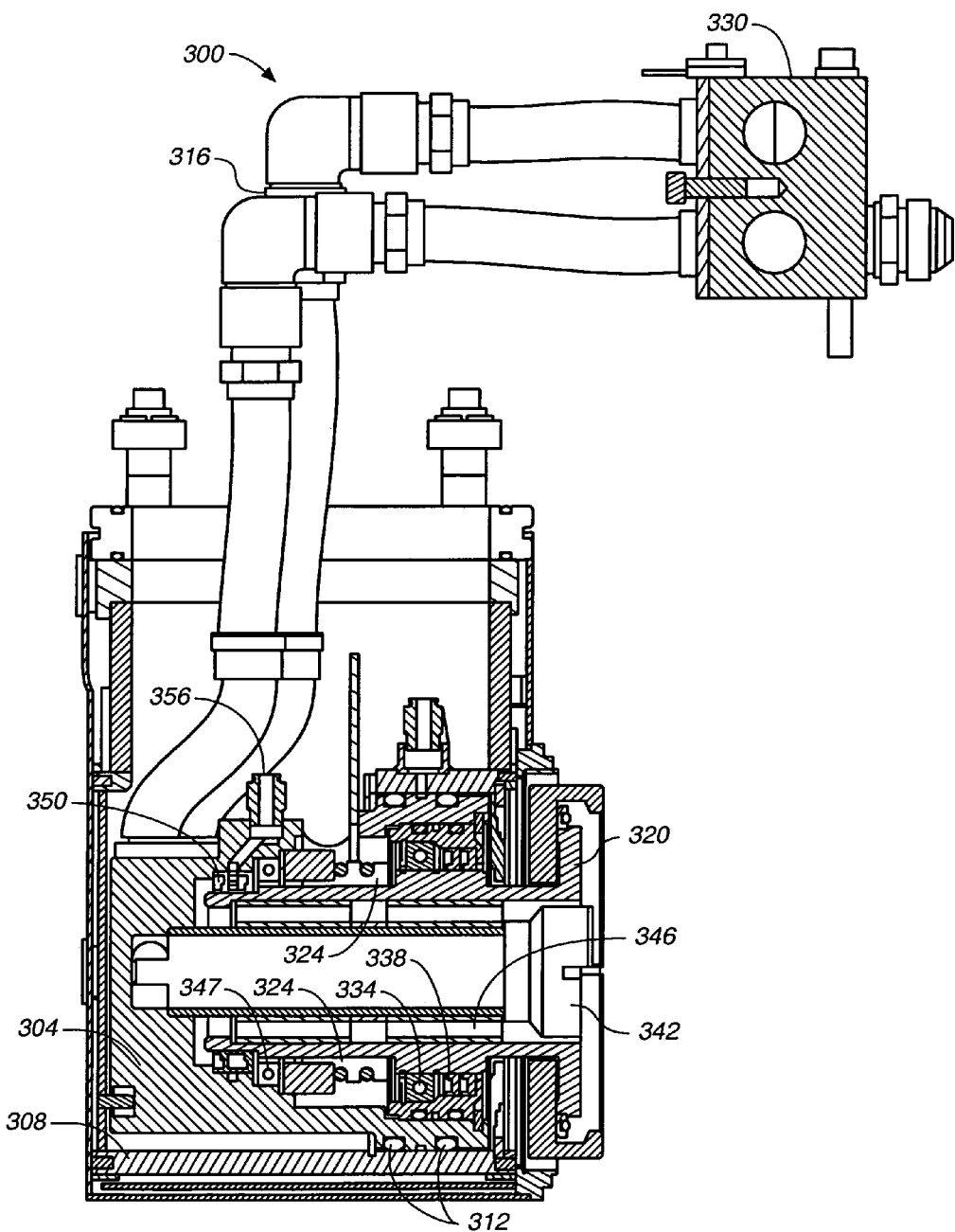
FIG._1B

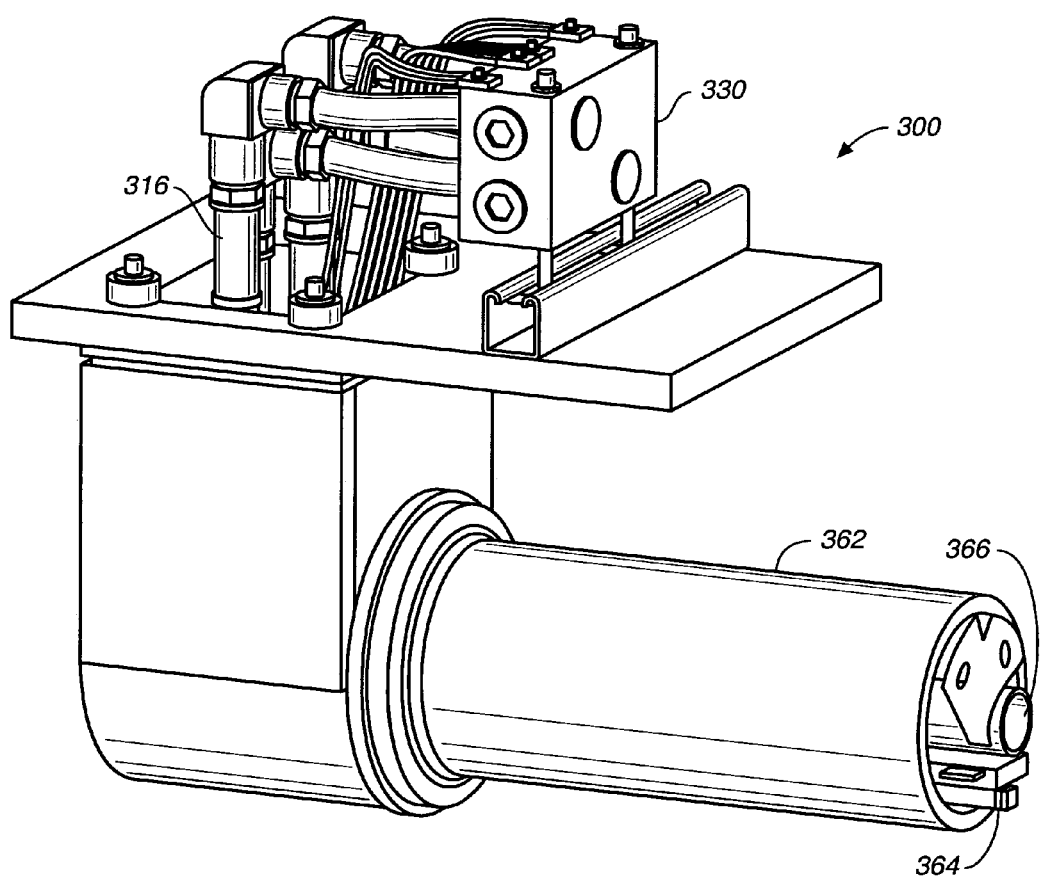
FIG._1C

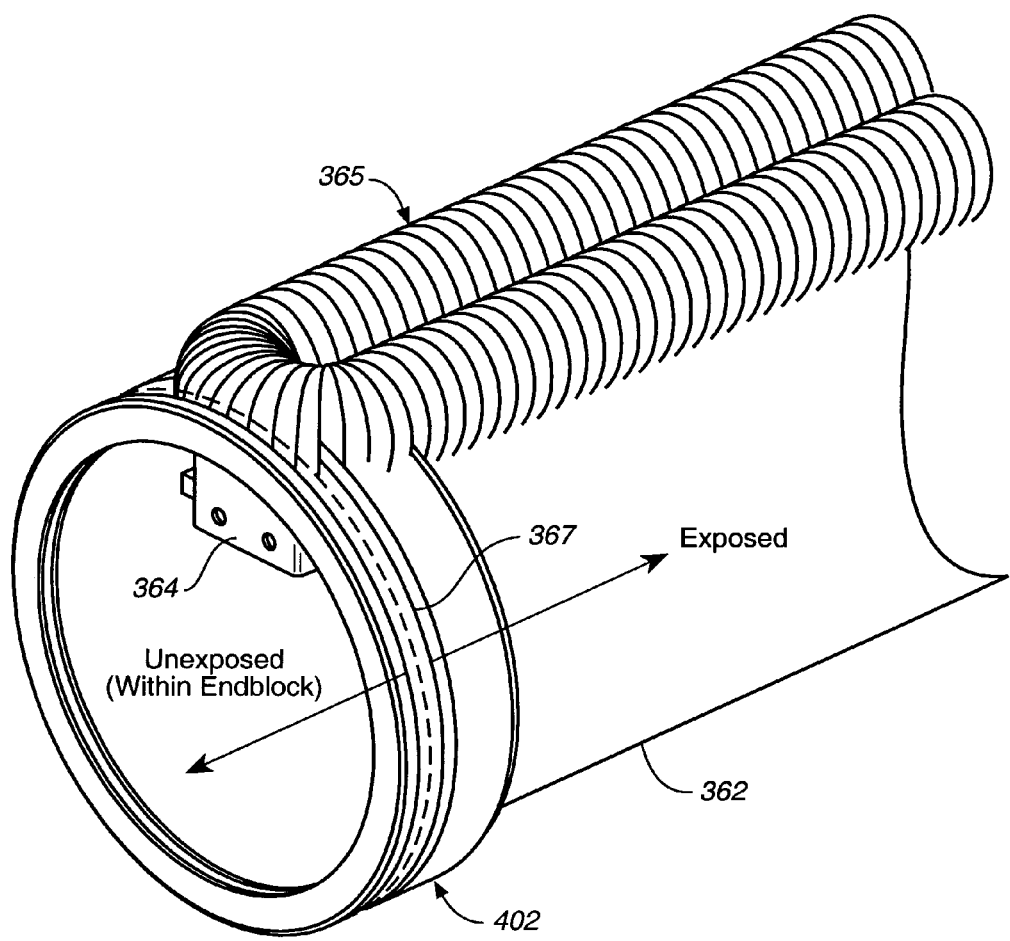
FIG._2A

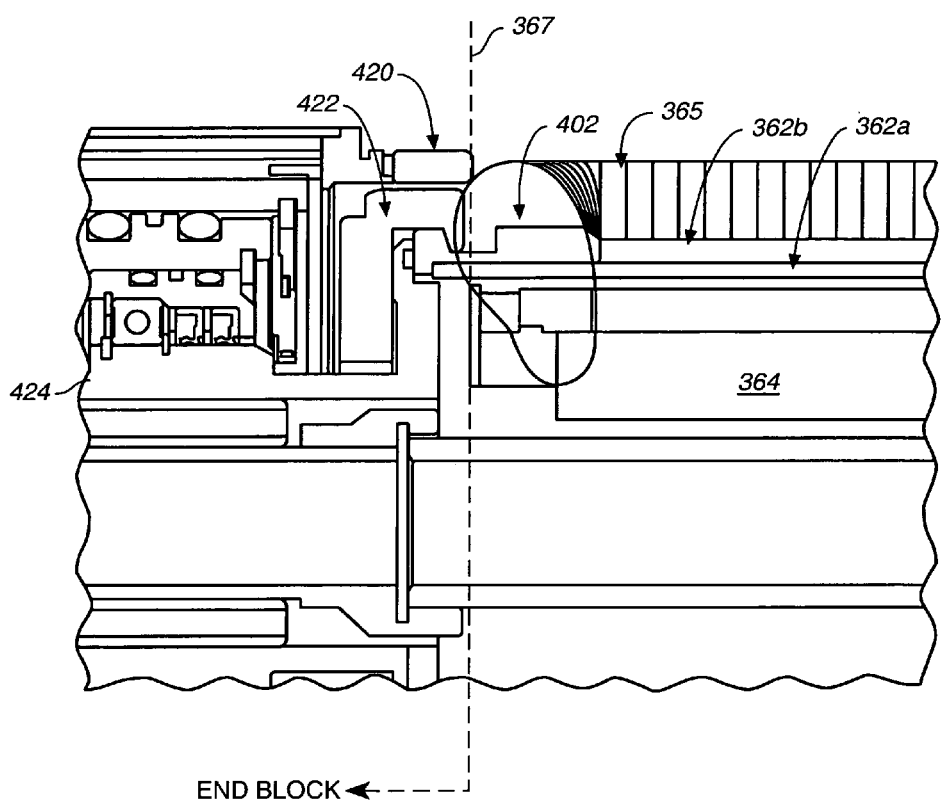
FIG._2B

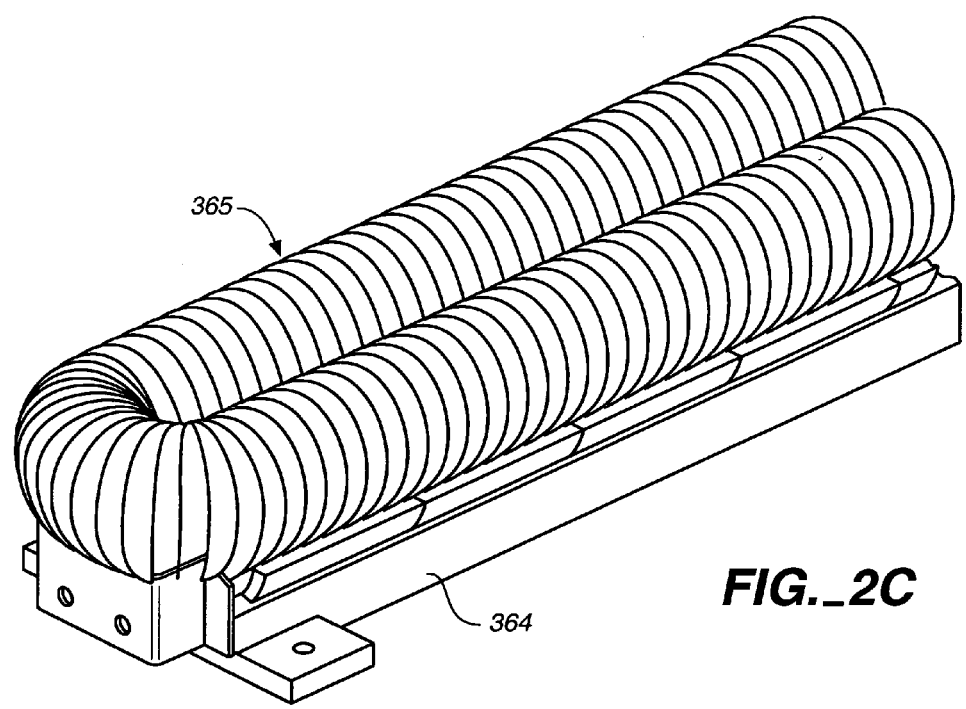
FIG._2C
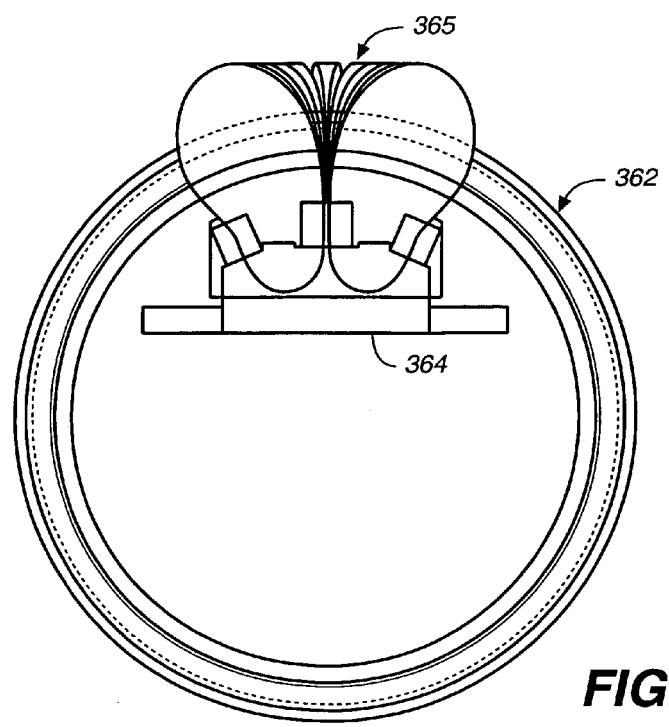
FIG._2D

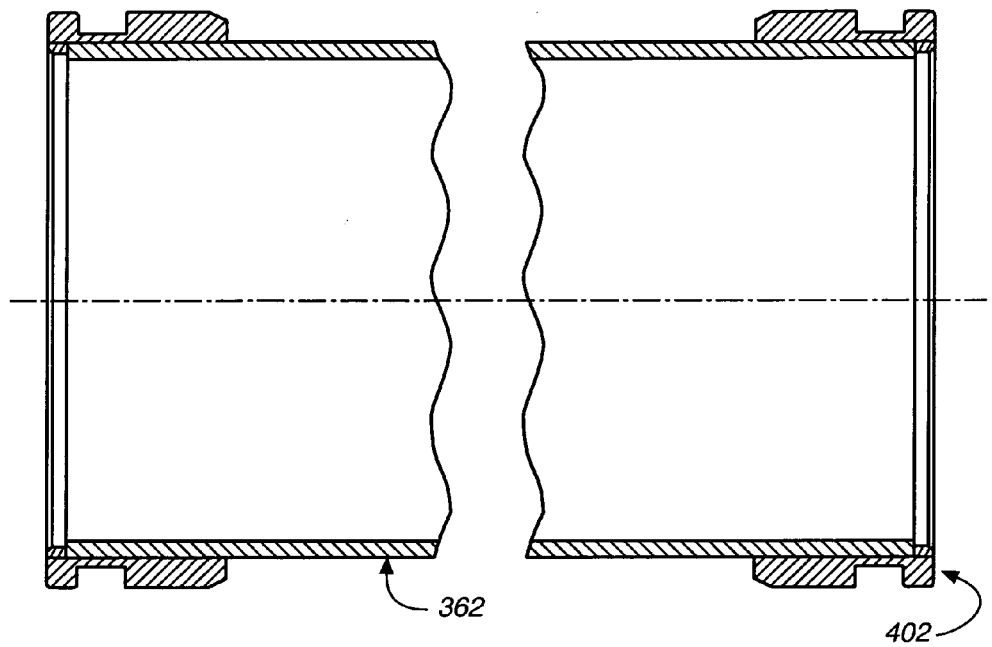
FIG._3
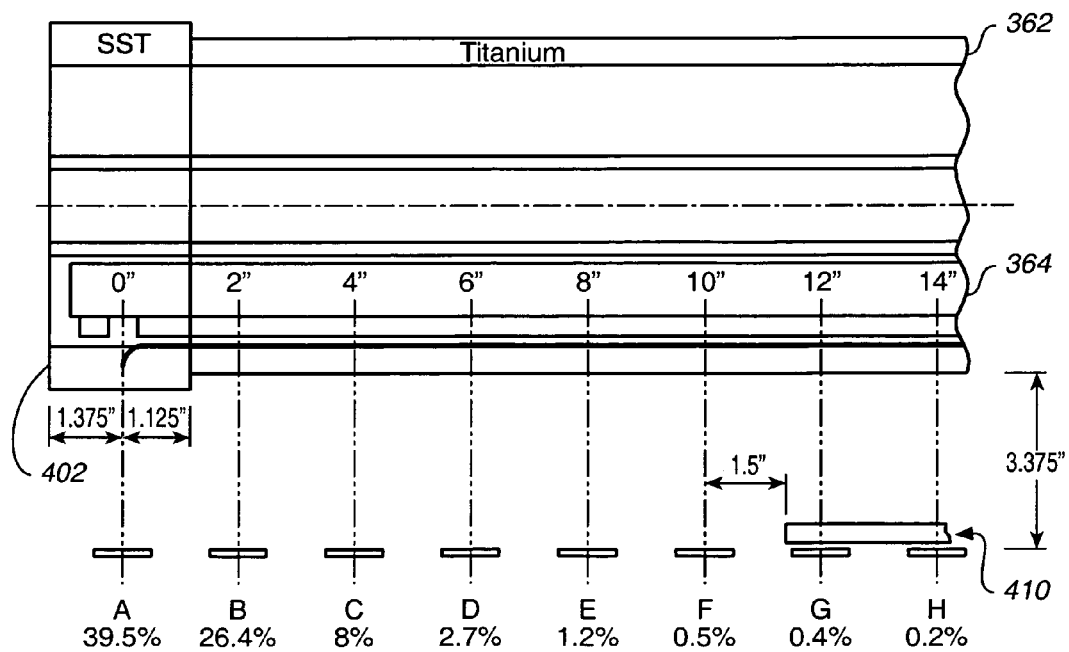
FIG._4

CYLINDRICAL MAGNETRON WITH SELF CLEANING TARGET

BACKGROUND

1. Field of the Invention

The present invention relates generally to sputtering systems and more specifically to an improved cylindrical magnetron.

2. Related Art

Sputtering is the process most often used for large area commercial coating applications, such as the application of thermal control coatings to architectural and automobile glazings. In this process, the substrates to be coated are passed through a series of in-line vacuum chambers isolated from one another by vacuum locks. Over the years, the magnetron used in these coaters has evolved from a planar to a rotating cylindrical design.

The rotating magnetrons while solving some problems produced others. These problems include new arcing phenomena, which are particularly troublesome in the DC or AC reactive sputtering of dielectric or insulating materials such as silicon dioxide, aluminum oxide and zirconium oxide. Insulating materials like silicon dioxide are particularly useful to form high quality, precision optical coatings such as multilayer, antireflection coatings and multilayer, enhanced aluminum reflectors, but are particularly difficult to sputter evenly and consistently. This is generally due to arcing that occurs at the ends of the magnetron due to buildup or condensation of the sputtered insulating materials.

A cylindrical magnetron generally comprises a rotating target tube having the material to be sputtered onto a substrate to be coated. Within the target tube is a 'racetrack' shaped magnet that is part of a system that excites ions to bombard the tube and sputter off atoms, which in turn coat the substrate. The racetrack shaped magnet has 'turn-arounds' at both ends of the target tube. The turnarounds possess two significantly different properties than at the center area of the magnet assembly: 1) A relatively greater magnetic field strength and 2) a greater unit area at the target surface (roughly 3:2) being influenced by the magnetic field. Thus the sputtering material of the target tube sputters more rapidly near the turnaround. This has two noteworthy consequences. First, because the sputtering rate is higher in that area, if the article to be coated is located directly under or sufficiently near the turnaround, it will have a thicker coating deposited on it. Second, the target tube will wear much more rapidly at the turnaround area, and much of the central area of the target tube will go to waste if the tube is changed when the turnaround area has worn thin.

Additionally, to date, there always exists a portion of the target tube, at the ends of the target tube that is out of the effective range ('sputtering zone') of the magnetic field created by the racetrack. This portion out of the sputtering zone, yet not within the endblock will be referred to as 'the unsputtered ends.' The sputtering zone is self-cleaning because material is constantly being sputtered off, but the unsputtered ends are not self cleaning. In fact, material sputtered from the sputtering zone, in addition to coating the substrate, also coats other surfaces within the reactive chamber of the magnetron including the unsputtered ends. The unwanted coating is referred to as condensate.

When certain dielectrics are being sputtered and coat the unsputtered ends, arcing may occur. As dielectric films accumulate on the unsputtered ends, charge can build up rapidly and an arc may be produced when the dielectric film breaks down under the high electrical field produced by the charge accumulation across the film. The higher the dielectric constant of the film, the more likely arcing is to occur.

Arcing results in a non uniform coating of the substrate, and is therefore detrimental to cost effective operation, as any article being coated when an arc occurs will most likely be defective. For instance, the article may be contaminated by debris resulting from the arc, or it may have an area with incorrect film thickness caused by temporary disruption of the discharge conditions. Furthermore, the occurrence of arcs increases with operating time, and eventually reaches a level which requires that the system be shut down for cleaning and maintenance.

Many different approaches have been developed to minimize arcing and the consequences of arcing.

U.S. Pat. No. 5,108,574 to Kirs et al., hereby incorporated by this reference in its entirety, utilizes a shield to cover the unsputtered ends in order to minimize arcing. This type of dark space shield prevents the re-deposition of condensate on the target ends or backside. The idea in this patent is to provide a cylindrical enclosure that surrounds the sputter target and has an opening in the region where the sputtering occurs. In essence, a dark space shield that prevents re-deposition of condensate or ignition of plasma at or near the target ends or backside.

The cathode dark space is the darker region of the plasma near the cathode surface where most of the potential drop in a diode discharge occurs. A dark space shield is a grounded surface which is placed at less than a dark space distance from the cathode in order to prevent the establishment of a discharge in the region between the two surfaces. The dark space distance is proportional to the mean free path in the gas and thus the level of vacuum.

This patent applies to targets, used for research and development purposes, that are about 1 foot long and 3" in diameter. Although the shielding may perform well on a small research system, scale-up to a production coater has proven to be difficult and more importantly, the problems associated with condensate adhering to the shield are not addressed; namely arcing and condensate falling onto the substrates.

U.S. Pat. No. 5,213,672 to Hartig et al., hereby incorporated by this reference in its entirety, utilizes an improved shield that can be implemented on large scale magnetrons.

U.S. Pat. No. 5,364,518 to Hartig et al., hereby incorporated by this reference in its entirety, manipulates the turn-arounds of the racetrack shape magnet to minimize the Gaussian field in the turnarounds. This improves target utilization but runs the risk of losing electron confinement thereby potentially reducing the effectiveness of the magnetic array.

U.S. Pat. No. 5,527,439 to Sieck et al., hereby incorporated by this reference in its entirety, electrically floats the end shields so arcing cannot occur between the end shield and the target, incorporates grooves into the outer surface of the end shield that limit the damage an arc can cause when the condensate deposits on the outer surfaces of the end shield initiate an arc, and uses a notched area in the end shield that provides better shielding against redeposition of condensate.

U.S. Pat. No. 5,725,746 to Dickey et al., hereby incorporated by this reference in its entirety, utilizes a cylindrical region on each end of the cathode body which has a surface of a collar material different from the target material. The cylindrical region extends into the sputtering zone typically for a distance of about two inches. The collar material is sputtered as the target material is sputtered, but typically at a lower rate. The sputtered collar material forms films having poor insulating properties. These films deposit on the unsputtered cathode ends, dark space shielding and support structures in preference to the material sputtered from the target. Electrical leakage through these poorly insulating films reduces charge build-up and arcing.

U.S. Pat. No. 5,853,816 to Vanderstraeten, hereby incorporated by this reference in its entirety, incorporates a simple and straightforward approach . . . put more material where it is needed, at the ends of the target tube. This is cost effective for plasma-sprayed targets and results in high utilization for the cathode approaching roughly 90%+. However, it is cost prohibitive when using most other targets due to machining and material costs. Additionally, the thicker than normal area at the target ends mechanically interferes with most standard end shielding in use today and therefore provisions such as modifications to the end shield must be made. Finally, material thickness is ultimately limited by the physics of magnetic field strength diminishing with distance; when material thickness is too great, the magnetic field at the target surface becomes too weak and electron confinement is degraded and eventually lost all together All of the aforementioned approaches fail to solve the underlying cause of the problem.

SUMMARY

In prior magnetron designs, it was assumed that the end(s) of target can not be sputtered clean, and therefore the prior magnetrons were designed to minimize the effects associated with arc activity at the ends. The magnetron of the present invention, however, sputters the entire length of the target tube that is not within the endblock, and thus virtually eliminates condensate at the ends of the target tube, where arcing would otherwise take place. It is possible to sputter along the entire length of the target tube at very high voltage and current levels without damaging the end blocks because the endblocks of the magnetron are well cooled and electrically isolated. The robust endblocks can withstand the placement of the magnetic array very near to the endblocks such that the magnetic field actually passes through the endblocks with a field strength high enough to sputter all of the exposed target tube. This results in a entirely self cleaning target tube.

Additionally, the magnetron of the present invention has a high target utilization rate through the use of additional and/or lower sputtering rate material on the target tube located at the turnaround areas of the magnetic array.

BRIEF DESCRIPTION OF THE FIGURES

FIG. 1A is a cross section of drive endblock 200.

FIG. 1B is a cross section of the water endblock 300.

FIG. 1C is a perspective view of water endblock 300 together with a part of the target tube.

FIG. 2A is a perspective view of the target tube.

FIG. 2B is a cross section of the target tube along the principal axis of the target tube.

FIG. 2C is a perspective view of the magnetic array.

FIG. 2D is a cross section of the target tube and magnetic array taken through a diameter.

FIG. 3 is a cross section of the target tube showing the fixation to the endblocks.

FIG. 4 is a cross section illustrating the amount of collar material deposited along the length of the target tube.

DETAILED DESCRIPTION

What holds true generally in American society holds true for cylindrical magnetrons: bigger is better. Magnetrons are continually utilizing bigger and stronger power supplies. An example of a typical power supply today is rated for 120 kW AC and 150 kW DC capable of pumping out 300 amperes. Another example of a typical power supply operates at 180 kW AC and is capable of 600 amperes. In the future, ever larger power supplies will be available.

As discussed in the background, a cylindrical magnetron generally comprises a target tube and one or more endblocks that supply power to the target tube, rotate the target tube, supply cooling water to the target tube, and position a stationary magnetic array within the target tube. Sputtering occurs along the length of the magnetic field of the magnetic array. The magnetic field, together with the electrical potential created between the cathode and anode of the magnetron can be quite destructive and must be managed very well if the magnetron is to be capable of sustained coating operations.

Usage of these ever larger power supplies requires more powerful cooling systems and electrical isolation. Without these features, the endblocks of the magnetron would eventually fail. In some circumstances the failure may be rapid and even catastrophic, with the endblocks melting and large volumes of cooling water leaking into the glass coating operations.

In prior designs, the magnetic array is spaced some distance away from the endblock. This is done in order to ensure that the magnetic field produced by the magnetic array does not 'contact' or pass through the endblock (with any significant field strength) in order to prevent such catastrophic failures. Magnetic field strength diminishes with distance. In all prior designs, the magnetic array is positioned so that the field strength diminishes to the point that it will not damage the endblock—which means that it is so diminished at the ends of the target that it will not sputter the entire usable or exposed length of the target. This results in unsputtered ends of the target tube, as described in the background. In the present invention the magnetic field can extend all the way to the endblocks because of the improved cooling and electrical isolation present within the endblocks.

This explains why, until now, the ends of the target tube in all of the aforementioned magnetrons remained largely un-sputtered, or were not 'self cleaning.' In the case of prior designs where the central portion of the target tube is sputtered, while the ends of the target tube are not sputtered, the central portion is referred to as 'self cleaning' because the continuous sputtering of the tube sputters or 'cleans' any condensate (sputtered material) from the central area, whereas condensate that may be deposited upon the ends is not sputtered, and thus the ends are not 'self cleaning.'

The endblocks of the magnetron will now be briefly described with regard to FIGS. 1A–1C. The target tube and magnetic array will be discussed in detail with regard to FIGS. 2–4. For more information please refer to U.S. patent application Ser. No. 10/052732 to Richard Barrett, filed on Jan. 18, 2002, and entitled 'Cylindrical AC/DC Magnetron With Compliant Drive System And Improved Electrical And Thermal Isolation,' now U.S. Pat. No. 6,736,948, which is hereby incorporated by this reference in its entirety.

Drive Endblock

FIG. 1A is a cross section of drive endblock 200. The drive endblock 200 interfaces to the target tube assembly (not shown) via drive endcap 202. Drive endcap 202 has a multi-lobed spline on drive endcap core 203. Axial compliance, or freedom of movement about the axis first occurs at the interface between the drive endcap core 203, which has a male multi-lobe spline and insulating member 206. Insulating member 206 has an internal female multi-lobed spline (not shown) that mates with the endcap core with a limited amount of designed in looseness to provide a first compliant coupling with angular or rotational freedom. The inner diameter (ID) of insulating member 206 is larger than the outer diameter (OD) of endcap core 203 and the spline is smaller than the female multi-lobed spline of insulating member 206. Thus, the drive endcap 202 can pivot about axis of rotation at this first axially compliant coupling between drive endcap 202 and insulating member 206. 'Axially compliant' means that a component, in this case drive endcap 202 can pivot or move about the axis (±x and ±z direction) and can move along the axis (±y direction), while rotating about the axis. The drive components do not have a shaft at the axis of rotation and thus are not limited in their range of movement in relation to the axis of rotation.

Water Endblock

The water endblock 300 is illustrated in FIGS. 1B and 1C. FIG. 1B is a cross section of the overall endblock, and FIG. 1C is a perspective view of water endblock 300 together with a part of the target tube.

The water endblock 300 generally supports the rotating target tube 362 while circulating water through the target tube, and providing the electrical power to the target tube for the sputtering process. Water arrives through the dual purpose water manifold/electrical block 330. This brass block is not only a water manifold, but also acts as an electrical manifold and heat sink. For convenience during the assembly process and for subsequent maintenance including replacement of the electrical components and the target tube, the electrical supply lines are broken into replaceable segments. Power is brought to the manifold 330 by a first set of segments (not shown) and connected to segments leading to the target tube. The junction of these segments (not shown) is at the water manifold/electrical block 330. The high current and voltage carried by these segments is transferred at the water manifold so that the high heat that will develop at the junction between the wire segments is dissipated by the water cooled brass block 330. The water then flows through flexible water lines 316 made of a compliant material such as rubber. In FIGS. 6 and 7, only two of the four water lines are shown. In FIG. 1C all four water lines can be seen.

Flexible water lines 316 enter the water endblock primary housing (WEPH) 308 and connect to water endblock isolation housing (WEIH) 304. WEIH 304 incorporates a water spindle 320 that accomplishes multiple functions such as supporting and locating a stationary magnetic array internal to the target tube 362, transferring the electrical power to/from the target tube 362 via the electrical brush blocks 324 and providing the interface for the supply and return flow of target tube cooling water through water lines 316. The water spindle 320 is isolated from direct electrical contact with the primary housing 308 by the isolation housing 304. Water spindle 320 is preferably made of 304 stainless steel because the strong electrical field surrounding the spindle and the current flowing through the spindle will not produce large amounts of inductive heat in a cylindrical form made of 304 stainless steel. Simply stated, 304 stainless steel has been found to be largely immune to the effects of inductive heating, especially in cylindrical geometries.

Within water spindle 320 is another spindle—anti-rotation spindle 342. Dual vacuum seals 350 are located between WEIH 304 and water spindle 320 and seal the high pressure water from the surrounding vacuum environment and vice versa. Between the two seals a water sensor determines if the first seal has been breached and triggers a status alert at the user interface. The water sensor is connected to and monitors interseal cavity port 356. Flow through water bushings 346 are located between water spindle 320 and anti-rotation spindle 342. The anti-rotation spindle 342 holds the magnetic array 364 within the target tube stationary while the water spindle 320 is rotating around it and water is flowing within and around the anti-rotation spindle 342.

Water first passes through anti-rotation spindle 342 and then through a support tube 366 that supports the magnetic array through the length of the target tube 362. The support tube 366 has a smaller diameter than the target tube and fits concentrically (or eccentrically) within the target tube 362. The water travels to drive endblock 200 within support tube 366 and then returns within target tube 362 outside of support tube 366 in the opposite direction and back into the water endblock 300. It enters water endblock 300 in the gap between water spindle 320 and anti-rotation spindle 342. It then flows through flow-through bushings 346 and exits the isolation housing 304 through water lines 316.

Power is applied to the water spindle 320 by brush blocks 324, which then transfer the power to the target tube 362 between water end block 300 and drive endblock 200 shown in FIGS. 3–5. The current travels from brush blocks 324 through water spindle 320 towards the target tube 362. Brush blocks 324 are flanked on both sides by bearings so that water spindle 320 can rotate within isolation housing 304, primary housing 308 and water endblock 300. On the outboard side (away from the target tube) is outboard bearing 347 which is conventional bearing made of steel or other commonly employed material. On the inboard side (towards the target tube) of the brush blocks 324 is bearing 334. Thus the current passes by inboard bearing 334 on a path to the target tube but does not pass by outboard bearing 347. Bearing 334 is a full ceramic bearing. The ceramic material has the advantage of being non-conductive, which means it will not heat up due to AC induction resulting from the current flow even though bearings 334 contact water spindle 320 in the current path from the brush blocks 324 to the target tube. The area of water spindle 320 that comes in contact with ceramic bearing 334 and water seals 350 is the most critical for bearing performance and water sealing. This area of water spindle 320 has a wear resistant, precision ground, hard chromed, and polished contact surface. This surface is created by depositing a hard chrome layer and then precision diamond lapping it. The ceramic bearing 334 is supported by bearing and seal carrier 360. Carrier 360 also supports dual vacuum seals 338.

Target Tube and Magnetic Array

FIG. 2A illustrates magnetic array 364 within target tube 362. Collar 402 surrounds the turnarounds of magnetic array 364, and will be described in more detail later. The magnetic field 365 produced by array 364 spans the entire exposed length of target tube 362. As discussed previously, magnetic field strength diminishes with distance. While the field therefore theoretically extends an infinite distance away from the magnetic array, only the portion with sufficient strength to cause sputtering is illustrated for practical purpose. The magnetic field strength at the target surface is typically 120 gauss to 140 gauss. Below 100 gauss, problems with electron confinement arise. This is true because although the array 364 itself is slightly shorter than target tube 362, the field 365 extends past the ends of the array 364. The field 365 extends to and beyond the exposed portion of the target tube, which is possible because the end blocks are well cooled and can therefore withstand the heat and magnetic field effects from the proximate field 365. Because the field extends the length of the target tube, the target tube and magnetron are self cleaning. There is no unsputtered portion of the target tube, unlike in all prior designs. Therefore, arcing is drastically reduced or eliminated altogether with the present invention.

FIG. 2B is an axial cross section of the target tube and endblock taken axially through the axis of the target tube. The coupling of the target and endblock is similar at both endblocks, although the water endblock 300 is shown in FIG. 2B. Anything to the left of the dotted line 367 is within the endblock. Dotted line 367 defines the boundary of the endblock and delineates the boundary between the exposed and unexposed (within the endblock) portions of the target tube. Spindle 424 is coupled to target tube 362(*a+b*) at collar 402 with clamp 422, and all of these components rotate together, while magnetic array 364 is stationary. Magnetic field 365 spans the entire length of the target tube not within the endblock, which may also be thought of as the exposed or usable portion of the target tube. Magnetic field 365 also passes or penetrates some distance within the endblock with a relatively high field strength. Thus, there is no usable or exposed portion of the target tube that is unsputtered. In other words, the sputtering zone encompasses the entire exposed and/or usable length of the target tube. Therefore, the magnetron, and the target tube is entirely self-cleaning, and condensation and arcing attributed to condensate should not occur at any point on the target tube. This results in a coating free from defects caused by these phenomena. FIG. 2b shows a dark space created by target clamp 422 and floating endblock cover extension 420 working in tandem. This dark space is designed to prevent plasma ignition in or near the endblock and has no contribution to the sputter process at the target. Furthermore, line of sight prevents condensate from collecting in undesirable areas on the interior of the endblock.

The target tube shown here is not a solid tube, but comprises a backing tube 362a and a sputtering material 362b upon the backing tube. Additionally, collar 402 may be considered part of the target tube. Collar 402 may be affixed to the backing tube 362a or may be integrally formed with the backing tube 362a. In some embodiments of the target tube, where the sputtering material is sufficiently self-supporting, a backing tube may not be present. In this case, the collar 402 may be integrally formed with the sputtering material, or may be affixed to the material. Preferably, although not necessarily, the collar 402 comprises a material with a lower sputtering rate than the sputtering material of the target tube.

It should be understood that the magnetic field intensity and shape is a function of the array geometry and other variables such as the material used for the permanent magnets and that the exact length of the magnetic array and target tube may vary, as long as the magnetic field extends the length of the exposed target tube.

FIG. 2C shows the magnetic array 364 and magnetic field 365 without the target tube. FIG. 2D shows the same components in a cross section taken through a diameter of the components.

FIG. 3 shows target tube 362 with collars 402. Collars 402 are positioned about the turnarounds of magnetic array 364 (not shown) in order to extend the life of the target tube 362. The collar material preferably has a lower sputtering rate than the target material. Material sputtered from the collar material will be deposited not only on the edges of a substrate being coated where it will be mixed with material sputtered from the target, but also on the endblocks. It is desirable to keep the ratio of sputtered collar material to sputtered target material on the substrate edges as low as possible. The sputtering rate of the collar material cannot, however, be zero. Otherwise, sputtered target material would eventually deposit on the support structures and cause arcing. Sputtering from the collar does not prevent material sputtered from the target from reaching these support structures. Rather, it ensures that the sputtered target material is mixed with the sputtered collar material, which destroys the insulating properties of the sputtered target material. The collar 402 preferably comprises a high melting point material.

A portion of collar 402 extends into the sputtering zone to cover the "turnaround" of the magnetic array sputtering zone where the magnetic field strength/density on the target tube (cathode) is highest. The remaining portion of collar 402 is within the endblocks. If the target material is a low melting point material or has a lower melting point than the collar material, higher power can be applied to the cathode body before the melting point of the target material is reached. Higher deposition rates for low melting point materials are, therefore, achievable using such collars on the cathode body.

The collars 402 have a recessed portion where a part of a clamp fits. The clamp couples the target tube to the endblocks. In particular, the clamp couples the endblock spindles to the collars and the target tube.

FIG. 4 illustrates the amount of collar 402 material that is deposited in the potential coating area under target tube 362. The amount of collar material may vary depending on the materials used and the geometry of the target tube and the collar. The particular data shown is for a titanium target tube and a stainless steel collar. Collar 402 is shown as a simple rectangle in cross section to illustrate the deposition profile. However, any number of various collar configurations and shapes are within the scope of the invention.

Ten samples were measured at various positions underneath the target tube. The magnetic array 364 is shown in a sputter down configuration for illustrative purposes. In other figures, it was shown in a 'sputter up' configuration. In order to measure the deposition profile, a series of silicon wafers were placed on a glass carrier that is located 3.375" under the titanium target. Five thousand angstroms of titanium metal was sputtered onto the wafers using a DC Halmar power supply in an argon plasma. Ten samples were submitted for EDS (Energy Dispersion Spectroscopy) analysis: the samples were portions of silicon wafers with Ti—Fe thin film depositions identified by the letters A through J. The Ti—Fe ratios, measured with quantitative EDS, are shown at the various positions. Sample A is positioned directly under the turnaround of magnetic array 364. Samples B through J were placed at two-inch intervals stretching toward the center of the target tube.

As can be seen in FIG. 4 and the following Table 1, the amount of Iron (Fe) from the stainless steel diminishes as the distance from the collar increases, until the amount of Iron is less than one weight percent from points F–J.

TABLE 1

Fe:Ti Deposition Profile

| Sample | Fe % wgt | Ti % wgt | Other minor elements |
|---|---|---|---|
| A | 39.5 | 41.7 | Cr-16.4%, Ni-2.4%, Al, Si |
| B | 26.4 | 60.7 | Cr-11.3%, Ni-1.6%, Al, Si |
| C | 8 | 88.2 | Cr-3.2%, Ni-.6%, Si, Al |
| D | 2.7 | 96 | Cr-1.1%, Ni-.2%, Si |
| E | 1.2 | 98.2 | Cr-.5%, Ni-.1%, Al, Si |
| F | .5 | 99.3 | Cr-.2%, Si |
| G | .4 | 99.6 | Al, Si |
| H | .2 | 99.8 | Cu, Si, Al |
| I | — | majority | Al, Si |
| J | — | majority | Al, Si (two sites analyzed: identical result) |

For illustrative purposes, the position of a substrate is also shown in the deposition profile setup illustrated in FIG. 4. The substrate 410 will preferably be positioned such that the largest recommended substrate will extend between points F and G, although other compromises between load size and deposition profile are within the scope of the invention. Preferably, a substrate will extend 0.5 inches past point G, or 11.5 inches from point A (the center of the turnaround). Therefore, any coating will contain a negligible amount of material from the collar. With such a configuration, a magnetron according to the present invention will be capable of depositing virtually all of the target material without worry of bursting the target at the turnarounds of the magnetic array, and will also coat a large substrate with only a negligible amount of the collar material.

The present invention results in a magnetron with considerable advantages over prior designs. A user will be able to reliably and evenly coat larger substrates without the mal-effects of arcing, and will need to user fewer targets while doing so. This saves not only the cost of target tubes themselves, but also minimizes costly down time when changing the tubes or otherwise attending to the magnetron due to arcing problems.

While particular embodiments of the present invention and their advantages have been shown and described, it should be understood that various changes, substitutions, and alterations can be made therein without departing from the spirit and scope of the invention as defined by the appended claims.

The invention claimed is:

1. A magnetron having endblocks, the magnetron comprising:
a cylindrical target tube comprising a material to be sputtered onto a substrate, the target tube consisting of portions of the target tube within the endblocks and an exposed portion without the endblocks, the cylindrical target tube having a closed circle groove near an end of the cylindrical target tube;
support structures located at the ends of the target tube that position the target tube and supply cooling water and power to the target tube, support structures including a support portion that has an outer circumference that is approximately equal to the circumference of the target tube;
a clamp that extends around the outer circumference of the support portion and the end of the cylindrical target tube; and
a magnetic structure within the target tube, the magnetic structure having a magnetic field that extends the length of the exposed portion of the target tube such that the entire exposed portion is sputtered.

2. The magnetron of claim 1 wherein the magnetic field is of sufficient strength along the entire length of the target tube to sputter along the entire length of the target tube.

3. The magnetron of claim 1 wherein the magnetron target tube is self cleaning, thereby minimizing the deleterious effects of electrical arcing.

4. The magnetron of claim 1 wherein the magnetic structure has a higher magnetic field density at the ends of the structure compared to the central portion of the structure, and wherein the target tube comprises an additional amount of material positioned about the ends of the target tube.

5. The magnetron of claim 1 wherein an additional amount of material is added near the ends of the target tube and the additional amount of material comprises the same material as the material to be sputtered onto the substrate.

6. The magnetron of claim 5 wherein the additional amount of material is integrally formed with the target.

7. The magnetron of claim 1 wherein an additional amount of material is added near the ends of the target tube, the additional amount of material has an uncovered cylindrical outer surface and the additional amount of material comprises a different material than the material to be sputtered onto the substrate.

8. The magnetron of claim 7 wherein the different material has a lower sputtering rate than the material to be sputtered and extends the life of the target tube.

9. The magnetron of claim 1 wherein an additional amount of material is added near the ends of the target tube and the additional amount of material is in the form of a collar ring attached to the target tube.

10. A cylindrical magnetron comprising:
a cylindrical target tube comprising a material to be sputtered onto a substrate, the cylindrical target tube having a closed circle groove near an end of the cylindrical target tube;
support structures located at the ends of the target tube that position the target tube and supply cooling water and power to the target tube, a support structure including a spindle portion that has an outer circumference that is approximately equal to the circumference of the target tube;
a clamp that extends around the outer circumference of the spindle portion and the end of the cylindrical target tube; and
a magnetic array within the target tube, the magnetic array positioned within the target tube such that a magnetic field generated by the magnetic array extends into the support structures and the target tube is self cleaning for its entire length except for portions that are within the support structures.

11. The magnetron of claim 10 wherein the magnetic array has a higher magnetic field density at the ends of the array compared to the central portion of the array, and wherein an additional amount of material is positioned about the target tube adjacent the higher magnetic field density.

12. The magnetron of claim 11 wherein the magnetron has an allowable substrate width, and wherein the additional amount of material is positioned such that it will be sputtered outside the allowable width and will not be substantially deposited upon the substrate.

13. The magnetron of claim 11 wherein less than one percent of a primary component of the additional material is deposited upon the substrate.

14. The magnetron of claim 11 wherein the additional material is different than the material to be sputtered.

15. The magnetron of claim 10 wherein condensate at the target tube ends is minimized to a level sufficient to prevent arcing at the target tube ends.

16. A magnetron comprising:
a target tube having a first collar with a first circular groove at a first end and a second collar with a second circular groove at a second end, the first and second collar formed of a first material, the target tube formed of a second material that is different to the first material;
means for supporting the target tube, the means for supporting the target tube including a first support portion that has an outer circumference that is approximately equal to the circumference of the target tube;
means for rotating the target tube, the means for rotating the target tube including a second support portion that has an outer circumference that is approximately equal to the circumference of the target tube;
a first clamp that extends around the outer circumference of the first support portion and the first end of the target tube;
a second clamp that extends around the outer circumference of the second support portion and the second end of the target tube; and
means for sputtering material from the target tube along the entire exposed length of the target tube, the means for sputtering material configured such that the only portions of the target tube that are not sputtered are inside the means for supporting the target tube and inside the means for rotating the target tube.

17. The magnetron of claim 16 further comprising means for extending the usable life of the target tube.

18. A method for preventing arcing in a magnetron, improving the coatings deposited upon a substrate, and increasing the efficiency of the magnetron, the method comprising:
providing a cylindrical target tube, the target tube having a length between a first end and a second end, the target tube having a first collar with a first circular groove at a first end and a second collar with a second circular groove at a second end, the first and second collars formed of a collar material that is not that target tube material;
providing a magnet array having a magnetic field;
providing a first endblock enclosing the first end and a second endblock enclosing the second end such that an exposed length extending from the first endblock to the second endblock remains exposed the first endblock including a first endblock portion that has an outer circumference that is approximately equal to the circumference of the target tube, the second endblock including a second endblock portion that has an outer circumference that is approximately equal to the circumference of the target tube;
providing a first clamp that extends around the outer circumference of the first endblock portion and the first end of the target tube;
providing a second clamp that extends around the outer circumference of the second endblock portion and the second end of the target tube; and
positioning the magnet array within the target tube such that the magnetic field extends along the length of the target tube and extends into the first and second endblocks and such that the entire exposed length of the target tube is sputtered during sputtering operations.

19. The method of claim 18 wherein the entire target tube is self cleaning.

20. The method of claim 18 wherein arcing from the target is eliminated.

21. The method of claim 18 further comprising providing additional material at high sputtering rate areas of the target tube.

22. A cylindrical target tube comprising a first material to be sputtered onto a substrate, a collar of a second material at an end, the collar having a circular groove and a magnetic array within the target tube, the target tube clamped at the ends to support structures having outer circumferences that are approximately equal to the circumference of the target tube, the target tube clamped to the support structures by clamps that extend around the outer circumferences of the support structures and the ends of the target tube, the magnetic array positioned within the target tube such that the entire unclamped portion of target tube is sputtered, the clamped target tube ends within endblock housings such that the unclamped portion extends between endblock housings.

23. A system for attaching a cylindrical sputtering target tube to an endblock, comprising:
a cylindrical target tube having a closed circle groove near an end of the cylindrical target tube;
an endblock portion that has an outer circumference that is approximately equal to the circumference of the target tube; and
a clamp that extends around the outer circumference of the endblock portion and the end of the cylindrical target tube.

24. The system of claim 23 wherein the target tube has a collar portion near the end of the cylindrical target tube and the groove is formed in the collar portion, the target tube comprising a target material and the collar portion formed of a collar material that is not the target material.

25. The system of claim 23 wherein the clamp extends about both the endblock portion and the end of the target in a radial direction and also extends into the groove to capture the endblock portion and the end of the cylindrical target tube in an axial direction.

26. A system for attaching a cylindrical sputtering target tube to an endblock, comprising:
a cylindrical target tube having a circular groove near an end of the cylindrical target tube, the cylindrical target tube having a collar portion near the end of the cylindrical target tube and the groove formed in the collar portion, the target tube comprising a target material and the collar portion formed of a collar material that is not the target material;
an endblock portion that has an outer circumference that is approximately equal to the circumference of the target tube; and
a clamp that extends around the outer circumference of the endblock and the end of the cylindrical target tube.

* * * * *